United States Patent
Cheng et al.

(10) Patent No.: US 9,565,042 B2
(45) Date of Patent: Feb. 7, 2017

(54) ULTRA-LOW POWER TRANSMITTER APPLIED IN MULTI-CHANNEL FREQUENCY SHIFT (FSK) COMMUNICATION

(71) Applicant: National Cheng Kung University, Tainan (TW)

(72) Inventors: Kuang-Wei Cheng, Kaohsiung (TW); Wen-Hao Ho, Taichung (TW); Sheng-Kai Chang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 14/985,214

(22) Filed: Dec. 30, 2015

(65) Prior Publication Data

US 2016/0191282 A1 Jun. 30, 2016

(30) Foreign Application Priority Data

Dec. 30, 2014 (TW) .............................. 103146172 A

(51) Int. Cl.
- *H04L 27/12* (2006.01)
- *H03L 7/099* (2006.01)
- *H03L 7/08* (2006.01)
- *H03L 7/24* (2006.01)

(52) U.S. Cl.
CPC ................ *H04L 27/12* (2013.01); *H03L 7/24* (2013.01); *H03L 7/0802* (2013.01); *H03L 7/0995* (2013.01)

(58) Field of Classification Search
CPC ....... H03L 7/0802; H03L 7/0995; H04L 27/12
See application file for complete search history.

(56) References Cited

U.S. PATENT DOCUMENTS

| | | | |
|---|---|---|---|
| 2009/0140817 A1* | 6/2009 | Deng | H03B 5/1265 331/17 |
| 2014/0072077 A1* | 3/2014 | Cheng | H04L 27/20 375/303 |

* cited by examiner

*Primary Examiner* — Ross Varndell
(74) *Attorney, Agent, or Firm* — Muncy, Geissler, Olds & Lowe PC

(57) ABSTRACT

An ultra-low power transmitter applied in multi-channel frequency shift keying (FSK) communication is provided. The transmitter includes a fixed-frequency generation device, a low-frequency frequency synthesizer, and an injection locking device. The fixed-frequency generation device provides a reference frequency to the low-frequency frequency synthesizer. The frequency synthesizer divides the reference frequency with corresponding divisors for generating a plurality of divided frequency signals. Then, the divided frequency signals are injected into the injection locking device. The injection locking device will lock at the average frequency of previously mentioned divided frequencies. Wherein, the injection locking device filters the high frequency noise, which is produced by the frequency synthesizer, at the time of the injection locking. The ultra-low power transmitter obtains a high-frequency transmitted signal by using the frequency-locked signal.

7 Claims, 7 Drawing Sheets

ULTRA-LOW POWER TRANSMITTER APPLIED IN MULTI-CHANNEL FREQUENCY SHIFT (FSK) COMMUNICATION

CROSS-REFERENCE TO RELATED APPLICATION

This application claims the benefit of Taiwan Patent Application No. 103146172, filed on Dec. 30, 2014, in the Taiwan Intellectual Property Office, the disclosure of which is incorporated herein in its entirety by reference.

BACKGROUND OF THE INVENTION

1. Field of the Invention

The present disclosure generally relates to a transmitter, in particular to an ultra-low power transmitter applied in multi-channel frequency shift keying (FSK) communication.

2. Description of the Related Art

Recently, the wireless communication systems have become more and more popularized in the application to the data transmission. It uses the transmitter to modulate the data to a specific frequency and transmit to the receiver. Afterwards, the receiver demodulates the received data. However, because the specific frequencies are mostly in the high-frequency band, the frequency synthesizer used in the conventional transmitters consumes high power and is not feasible in low power applications. Without a frequency synthesizer, the transmitter is only feasible for the single-channel communication or the coarse multi-channel communication.

Generally, the conventional transmitter architectures are classified with the following three types.

1. The transmitter with mixer and phase-lock loop (PLL). This transmitter modulates the data to a specific frequency, which has been processed by the frequency synthesizer through the mixer, wherein the data is to be transmitted. Then, the data would be transmitted by the power amplifier. Here, the frequency synthesizer, which is applied in this transmitter, is designed with PLL. Thereby, the entire architecture costs high power consumption because this transmitter must use the PLL.

2. The transmitter with closed-loop filter. This transmitter directly modulates the data, which are processed by the delta-sigma modulator at first, to a specific frequency at the frequency synthesizer. Then, the data would be transmitted by the power amplifier. Because the transmitter directly modulates the data to the specific frequency at the frequency synthesizer, the closed-loop filter must be existed. Thereby, the data rate would be limited when using this type of transmitter.

3. The transmitter with injection-locked oscillator. This transmitter modulates the data to different frequencies by directly amplifying the frequency to the desired band and adjusting the capacitance value of the capacitor of the voltage controlled oscillator (VCO). Because the modulation is performed by adjusting the capacitance value, the resolution of the frequency selection would be lower.

SUMMARY OF THE INVENTION

In view of the aforementioned technical problems, the objective of the present disclosure is to provide an ultra-low power transmitter applied in multi-channel frequency shift keying (FSK) communication. By means of the delta-sigma modulator and the fraction-type injection locking, instead of the conventional closed-loop filter, the multi-channel communication with high resolution can be achieved and the high-frequency noise caused by the delta-sigma modulator can be cancelled. Therefore, the frequency can be synthesized at the low-frequency band. Thereby, the power consumption would be reduced and the data rate would be promoted.

For the sake of achieving the aforementioned objective, the present disclosure provides an ultra-low power transmitter applied in multi-channel frequency shift keying (FSK) communication. The ultra-low power transmitter of the present invention may include a fixed-frequency generation device, a low-frequency frequency synthesizer and an injection locking device. The fixed-frequency generation device provides a reference frequency for the low-frequency frequency synthesizer. Wherein, the low-frequency frequency synthesizer receives the reference frequency many times according to a time sequence, and divides the reference frequency with corresponding divisors. Thereby, a plurality of divided frequency signals are generated. The injection locking device is electrically connected to the low-frequency frequency synthesizer. Wherein, the low-frequency frequency synthesizer injects the plurality of divided frequency signals to the injection locking device according to the time sequence. Thereby, the injection locking device generates a frequency-locked signal and filters a high-frequency noise resulted from the low-frequency frequency synthesizer at the same time. Here, the ultra-low power transmitter utilizes the frequency-locked signal to obtain a high-frequency emission signal.

Preferably, the low-frequency frequency synthesizer may include a fractional signal provider, a divisor provider and a frequency divider. The fractional signal provider provides a fractional signal for the divisor provider. The divisor provider sequentially generates the divisors according to the fractional signal, wherein some of the divisors are the same. The frequency divider is electrically connected to the fixed-frequency generation device, the divisor provider and the injection locking device. The frequency divider sequentially receives the reference frequency and the divisors to generate the divided frequency signals. Wherein, the locked frequency of the frequency-locked signal is related to the fractional signal.

Preferably, the ultra-low power transmitter applied in multi-channel frequency shift keying (FSK) communication of present disclosure may further include a detecting element. The detecting element detects a parameter of the fixed-frequency generation device and provides the parameter to the fractional signal provider. Here, the fractional signal provider may adjust the fractional signal according to the parameter.

Preferably, the ultra-low power transmitter applied in multi-channel frequency shift keying (FSK) communication of present disclosure may include a data loading device. The data loading device is electrically connected to the fractional signal provider and provides data to the fractional signal provider. Here, the fractional signal provider provides different fractional signals according to the received data. Thereby, the injection locking device generates the frequency-locked signals having different locked frequencies to modulate different data to different frequencies so as to achieve the ultra-low power transmitter applied in multi-channel frequency shift keying (FSK) communication.

Preferably, the divisor provider may have a noise-shaping delta-sigma modulator and a noise cancellation circuit which are electrically connected with each other. The noise-shaping delta-sigma modulator receives the fractional signal to generate the divisor and a quantization error noise. The noise cancellation circuit replaces the quantization error noise to a high frequency to change the quantization error noise to a high-frequency noise. Wherein, the injection locking device filters the high-frequency noise resulted from the noise-shaping delta-sigma modulator when locking the locked frequency of the frequency-locked signal, such that no extra filters is necessary.

Preferably, the ultra-low power transmitter applied in multi-channel frequency shift keying (FSK) communication of present disclosure may further include a frequency multiplier electrically connected to the injection locking device. The frequency multiplier multiplies the locked frequency of the frequency-locked signal to generate a high-frequency emission signal.

Preferably, the ultra-low power transmitter applied in multi-channel frequency shift keying (FSK) communication of present disclosure may further include a data loading device receiving the high-frequency emission signal. The data loading device adjusts the amplitude or the phase of the high-frequency emission signal according to the data, which is to be transmitted. Thereby, an amplitude shift keying (ASK) transmitter or a phase shift keying (PSK) transmitter can be achieved.

Preferably, the fixed-frequency generation device may be a crystal oscillator or a micro electro mechanical systems oscillator.

Preferably, the injection locking device may be formed of a plurality of ring oscillators.

As a result, the ultra-low power transmitter applied in the multi-channel frequency shift keying communication of the present disclosure may have one or more advantages as follows.

1. The purpose of multi-channel communication is achieved and the data transmission rate is promoted. This is because the low-frequency frequency synthesizer divides the reference frequency with corresponding divisors for generating a plurality of divided frequency signals, and utilizes the control input to control the divisor to designate the specific channel.

2. The present disclosure is feasible for the transmitter applied in multi-channel FSK communication. This is because the frequency synthesizer amplifies frequency after performing the aforementioned operation to achieve the accurate frequency control at the low-frequency band, by cooperating with the frequency multiplication technique with different multiplying powers. Besides, the power consumption can be reduced because synthesizing frequencies are performed in the low band.

3. No extra filters are necessary. This is because the injection locking device is electrically connected to the low-frequency frequency synthesizer, such that when injection locking device locks the locking frequency of the frequency-locked signal, the high-frequency noise resulted from the delta-sigma modulator of the low-frequency frequency synthesizer is filtered at the same time.

DETAILED DESCRIPTION OF THE PREFERRED EMBODIMENTS

Figure 1:
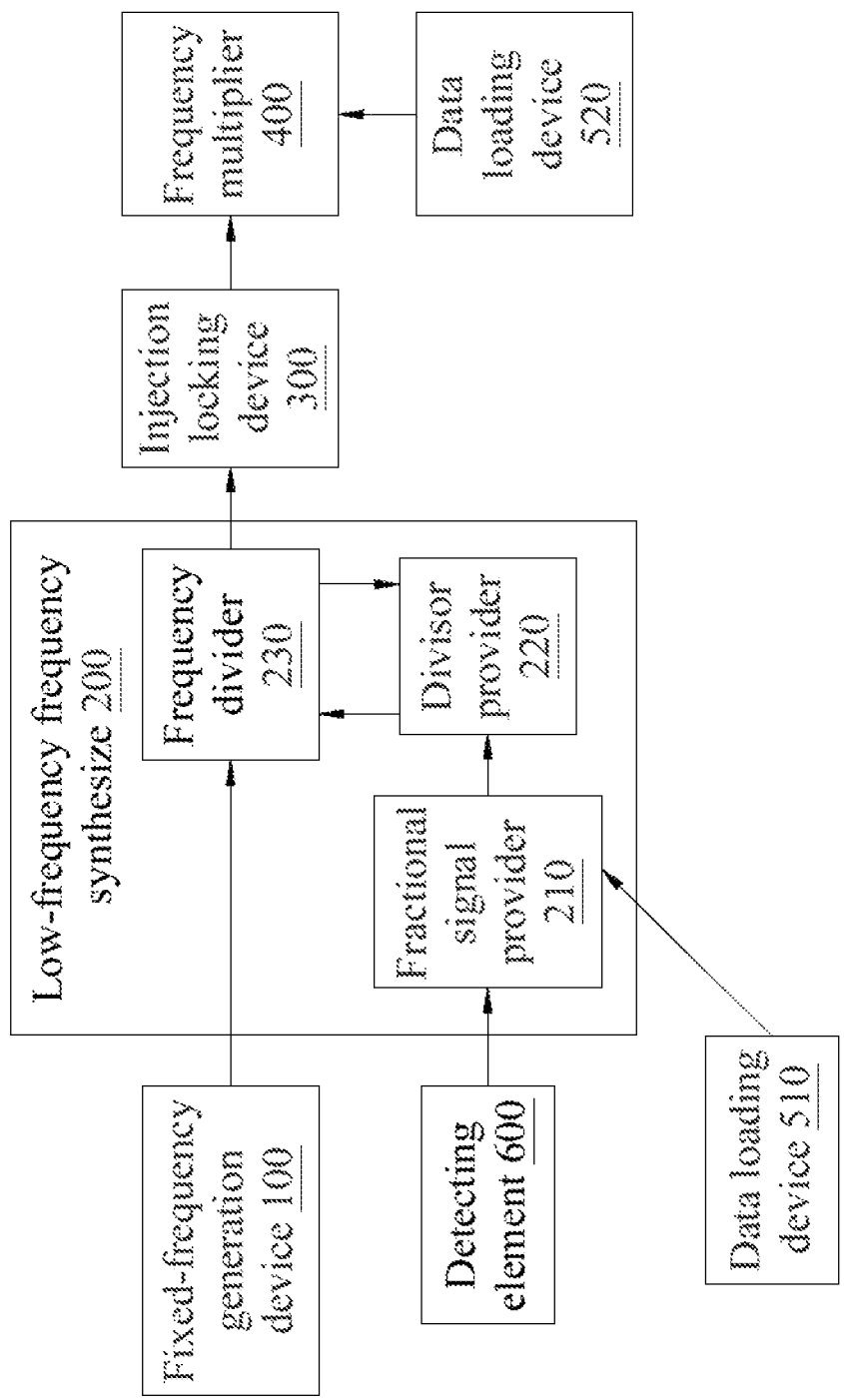
FIG. 1 is a block diagram illustrating the ultra-low power transmitter applied in the multi-channel frequency shift keying communication of the present disclosure.

Please refer to FIG. 1, which is a block diagram illustrating the ultra-low power transmitter applied in the multi-channel frequency shift keying communication of the present disclosure. As shown in the FIG. 1, the ultra-low power transmitter applied in the multi-channel frequency shift keying communication of the present disclosure at least includes a fixed-frequency generation device 100, a low-frequency frequency synthesizer 200 and an injection locking device 300. The fixed-frequency generation device 100 provides a reference frequency for the low-frequency frequency synthesizer 200. The low-frequency frequency synthesizer 200 receives the reference frequency many times from the fixed-frequency generation device 100 according to a time sequence and divides the reference frequency with corresponding divisors for generating a plurality of divided frequency signals. Here, the fixed-frequency generation device 100 may be a crystal oscillator, a micro electro mechanical systems (MEMS) oscillator, or any others which can periodically provide a reference frequency. For example, the fixed-frequency generation device 100 periodically provides the same reference frequency to the low-frequency frequency synthesizer 200. Namely, the fixed-frequency generation device 100 can provide the same reference frequency to the low-frequency frequency synthesizer 200 on numerous time points, such as the first time point, the second time point, the third time point, . . . etc. periodically. Wherein, the time interval between the time points can be the same.

The low-frequency frequency synthesizer 200 may include a fractional signal provider 210, a divisor provider 220, and a frequency divider 230. The fractional signal provider 210 provides a fractional signal for the divisor provider 220. Afterwards, the divisor provider 220 sequentially generates numerous divisors by a given division mechanism according to the received fractional signal. Here, these divisors are partially the same, that is, some divisors are the same and the others are different. For example, please refer to FIG. 2 and FIG. 3, which are a schematic diagram illustrating the first embodiment and the second embodiment of the divisor provider of the ultra-low power transmitter applied in the multi-channel frequency shift keying communication of the present disclosure, respectively. The difference between the first and the second embodiments lies that the $1^{st}$ order delta-sigma modulator (DSM) is applied to the first embodiment and the $3^{rd}$ order multi-stage noise-shaping (MASH) delta-sigma modulator (DSM) is applied to the second embodiment.

Figure 2:
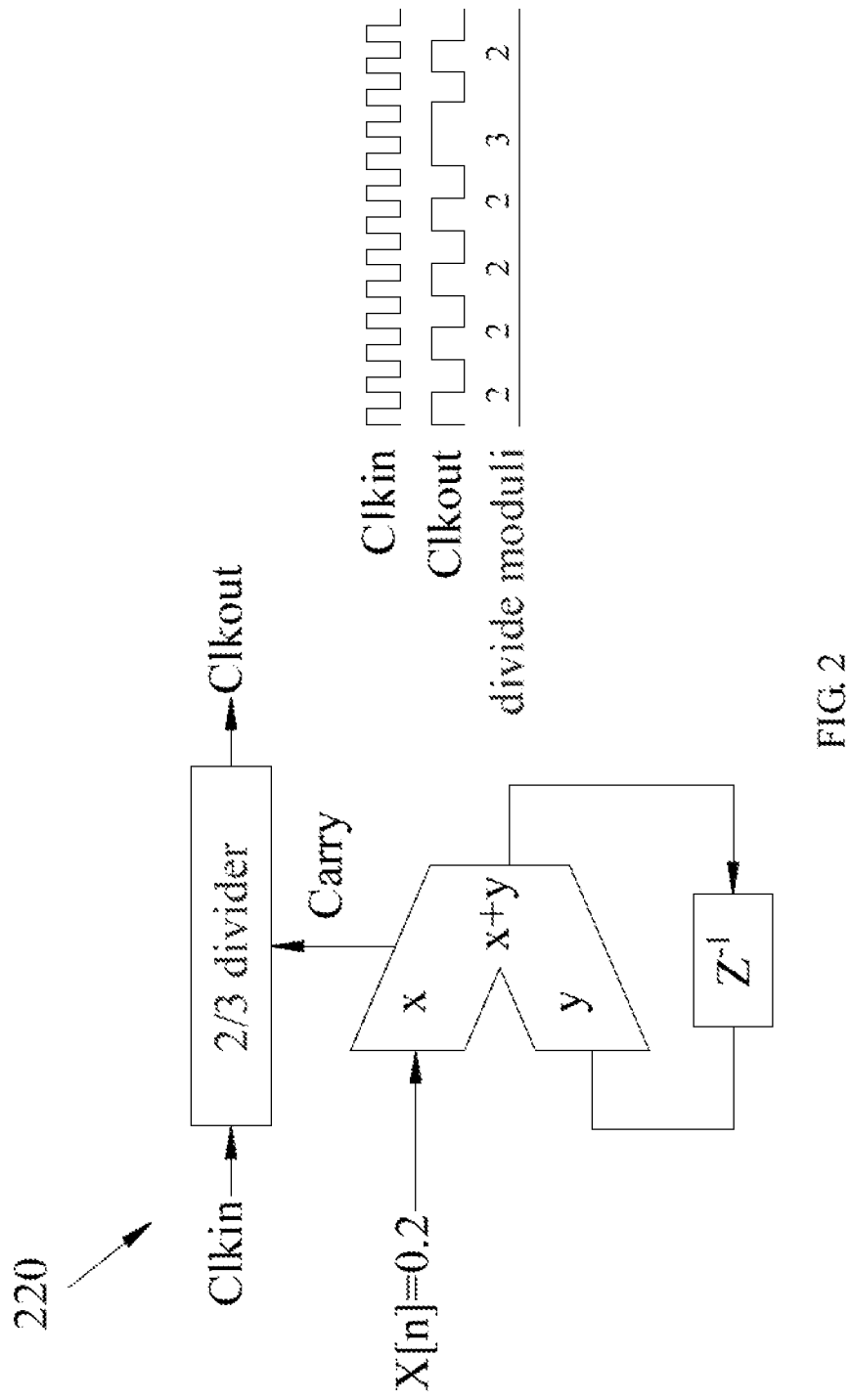
FIG. 2 is a schematic diagram illustrating the first embodiment of the divisor provider of the ultra-low power transmitter applied in the multi-channel frequency shift keying communication of the present disclosure.
Figure 3:
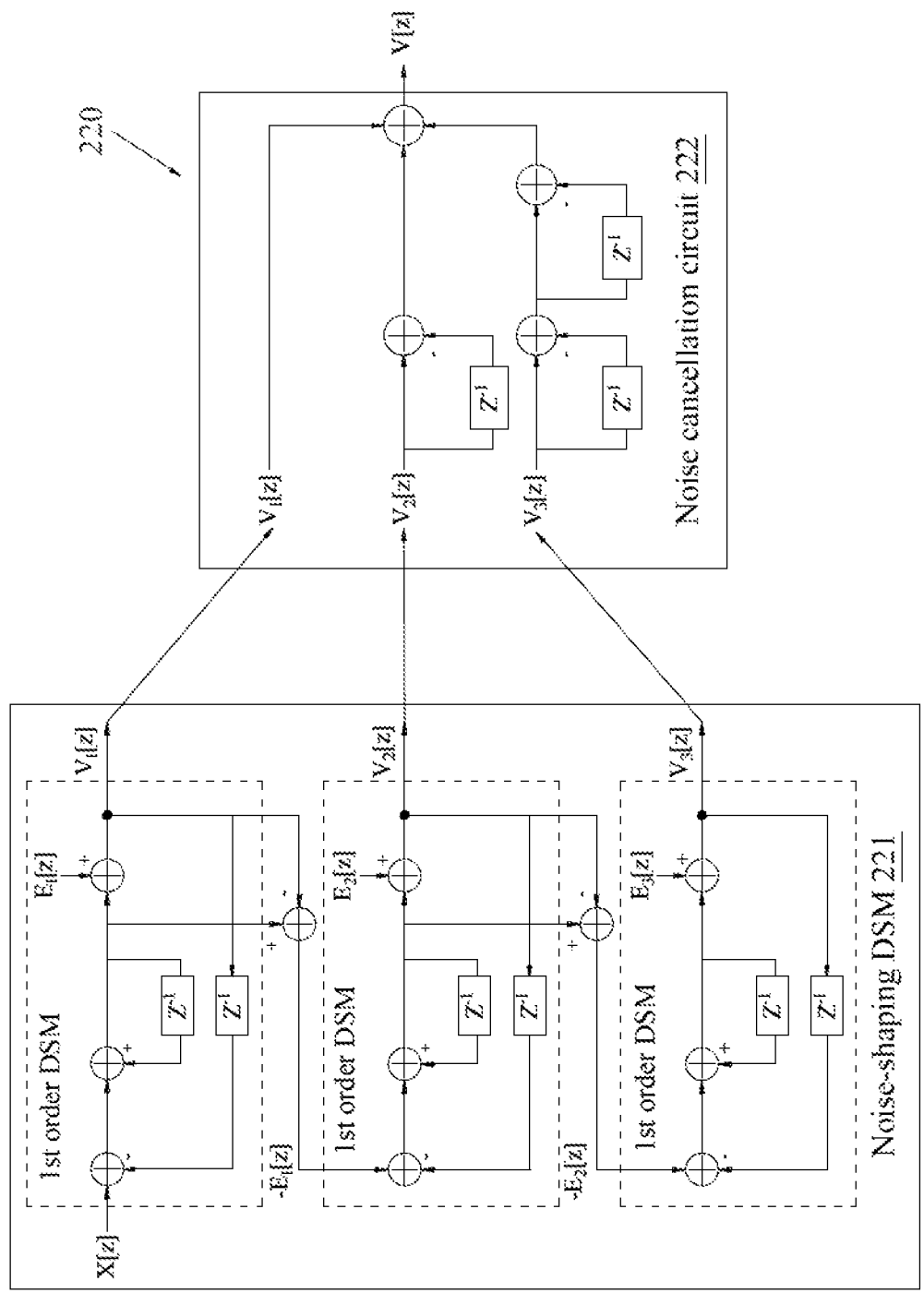
FIG. 3 is a schematic diagram illustrating the second embodiment of the divisor provider of the ultra-low power transmitter applied in the multi-channel frequency shift keying communication of the present disclosure.
Figure 4:
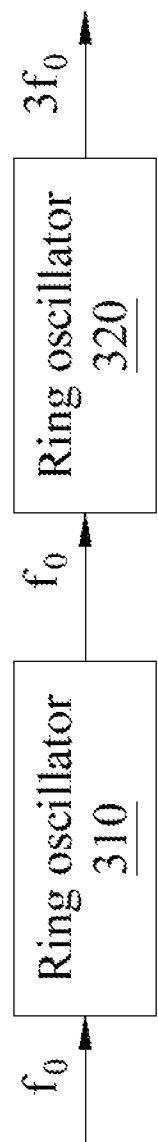
FIG. 4 is a schematic diagram illustrating the embodiment of the injection locking device of the ultra-low power transmitter applied in the multi-channel frequency shift keying communication of the present disclosure.

As shown in FIG. 1, FIG. 2 and FIG. 3, the fractional signal provider 210 periodically provides the divisor provider 220 with a fractional signal X[n]. The divisor provider 220 provides the signal carry to the divider ("⅔ divider" shown in FIG. 2, but not limited thereto) according to the received fractional signal X[n] and the predetermined resolution mechanism ("x+y" shown in FIG. 2, but not limited thereto), such that the divider outputs the same or different divisor in each time point. For example, the ⅔ divider continuously receives the fixed clock signal Clkin, wherein when the signal is carried, the divide moduli of the output clock signal Clkout is set to be 3; and when the signal is not carried, the divide moduli of the output clock signal Clkout is set to be 2. Here, the fractional signal X[n] may be 0.2. (Alternatively, numerals such as 0.3, 0.4 or other fractional signals X[n] can be provided according to the actual requirements, and different fractional signals can be provided in different periods for indicating different data transmissions, but the present disclosure shall be not limited thereto.) Namely, the divisor provider 220 respectively derives 0.2, 0.4, 0.6, and 0.8 at the first, second, third, and fourth time points through the resolution mechanism. As the signal is not carried, the divide moduli of the output clock signal of the ⅔ divider on the first, second, third, and fourth time points is 2. However, the divisor provider 220 derives 1 at the fifth time point by means of the resolution mechanism, such that the divide moduli of the output clock signal of the ⅔ divider on the fifth time point is 3 because the signal is carried at that time point. Hereby, a cycle is completed. Similarly, the divisor provider 220 derives a divisor at each time point.

However, the DSM may generate the unnecessary quantization error noise because of the cycle and different divide modulus. As a result, the second embodiment of the divisor provider 220 applied in the present disclosure uses a multi-order noise-shaping DSM 221 cooperating with a noise cancellation circuit 222 to randomize the cycle and replace the quantization error noise to the higher frequency. Thereby, the quantization error noise becomes the high-frequency noise. For example, the divisor provider 220 in the second embodiment is disposed with the noise-shaping DSM 221 and the noise cancellation circuit 222 which are electrically connected to each other. Wherein, the noise-shaping DSM 221 receives the fractional signal X[z]. (Here, the fractional signal X[n] on the time-domain is transformed into the fractional signal X[z] on the frequency-domain for the convenience.) Because the noise-shaping DSM 221 is $3^{rd}$ order MASH DSM, which may be consisted of three $1^{st}$ order DSM which are cascaded with one another, three intermediate signals $V_1[z]$, $V_2[z]$, and $V_3[z]$ are thereby generated. The three intermediate signals $V_1[z]$, $V_2[z]$, and $V_3[z]$ include divisors and the quantization error noises. The noise cancellation circuit 222 obtains the divisor signal V[z] by performing the time shift and multiplication to the three intermediate signals $V_1[z]$, $V_2[z]$, and $V_3[z]$. Consequently, the relative relationship of the divisor signal V[z], the fractional signal X[z] and the quantization error noise $E_3[z]$ are obtained as $V[z]=X[z]+(1-z^{-1})^3 E_3[z]$. Hereby, it can be found that the noise cancellation circuit 222 is capable of replacing the quantization error noise $E_3[z]$ to the high frequency to become the high-frequency noise, such as $(1-z^{-1})^3 E_3[z]$. Here, the MASH DSM consisted of three $1^{st}$ order DSM, which are cascaded with one another, would be more stable and can be achieved by combining simple accumulator and register. Therefore, the mismatch problem can be conquered by using the digital design.

The frequency divider 230 is electrically connected to the fixed-frequency generation device 100, the divisor provider 220 and the injection locking device 300. The frequency divider 230 sequentially receives the reference frequency and divisor to generate divided frequency signal according to the time sequence. For example, the fixed-frequency generation device 100 provides a reference frequency to the frequency divider 230 on a time point, and the divisor provider 220 also provides a divisor to the frequency divider 230 on the time point. Therefore, the frequency divider 230 receives the reference frequency and the divisor on this time point. Afterward, the frequency divider 230 divides the reference frequency with the divisor to generate a divided frequency signal of this time point. Then, the frequency divider 230 transmits the divided frequency signal to the injection locking device 300 and notices the divisor provider 220 to enter to next time point. On the next time point, the fixed-frequency generation device 100 provides the reference frequency to the frequency divider 230 again, wherein the reference frequency of this time point is the same with the reference frequency of the previous time point. Besides, the divisor provider 220 also provides the frequency divider 230 with another divisor, and the divisor provided herein and the divisor provided previously may be the same or different. Consequently, on the time point, the frequency divider 230 divides the reference frequency with the divisor again to generate a new divided frequency signal, which corresponds to the current time point. The new divided frequency signal is then transmitted to the injection locking device 300. Similarly, the frequency divider 230 provides the injection locking device 300 with the corresponding divided frequency signal on each time point. Wherein, the divisor provider 220 may provide the frequency divider 230 with the divisor with bit data type.

In addition, the ultra-low power transmitter of the present disclosure further includes a detecting element 600 electrically connected to the fractional signal provider 210. The detecting element 600 detects the parameter of the fixed-frequency generation device 100, such as the temperature, pressure, voltage of the fixed-frequency generation device 100, or the other manufacturing processes, or parameters of devices. Afterwards, the parameters detected by the detecting element 600 are provided from the detecting element 600 to the fractional signal provider 210. The fractional signal provider 210 adjusts the fractional signal, which is to be provided to the divisor provider 220, according to the received parameters. Therefore, the ultra-low power transmitter of the present disclosure is capable of adjusting or fine adjusting the fractional signal according to the actual conditions of the fixed-frequency generation device 100 so as to reduce the probability that the accuracy rate of emission signal is affected by the conditions of the fixed-frequency generation device 100. Here, the detecting element 600 may be detectors, such as a temperature detector, a pressure detector, or the other detectors which can detect the parameters of manufacturing process or devices.

The injection locking device 300 is electrically connected to the low-frequency frequency synthesizer 200. The low-frequency frequency synthesizer 200 injects the divided frequency signal to the injection locking device 300 according to the time sequence. Thereby, the injection locking device 300 generates a frequency-locked signal having a locked frequency and simultaneously filters the high-frequency noise resulted from the low-frequency frequency synthesizer 200. Afterwards, the ultra-low power transmitter of the present disclosure applies the frequency-locked signal to generate the high-frequency signal. Here, the locked frequency of the frequency-locked signal is related to the fractional signal provided by the fractional signal provider 210. For example, the frequency divider 230 injects the divided frequency signals corresponding to the current time point to the injection locking device 300 at each time point of a time period. Thereby, the injection locking device 300 filters the high-frequency noise, which is generated by replacing the quantization error noise $E_3[z]$ to the high frequency by the noise cancellation circuit 222, and simultaneously generates the frequency-locked signal corresponding to the time period at the same time according to the injected divided frequency signals. That is to say, while the present disclosure applies the injection locking device 300 to lock the synthesized frequency, the high-frequency noise resulted from the low-frequency frequency synthesizer 200 is filtered without using extra filter.

Here, the injection locking device 300 may be consisted of a plurality of ring oscillators which are electrically connected with one another. Please refer to FIG. 4, which is a schematic diagram illustrating the embodiment of the injection locking device of the ultra-low power transmitter applied in the multi-channel frequency shift keying communication of the present disclosure. As shown in FIG. 1 through FIG. 4, the injection locking device 300 may be formed of the ring oscillators 310 and 320 which are cascaded with one another, but the present disclosure shall be not limited thereto. An amount of the ring oscillators of the injection locking device 300 can correspond to the order of the DSM, e.g., the number of the $1^{st}$ DSM. Here, the ring oscillator 310 is applied to gradually filter the high-frequency noise resulted from the low-frequency frequency synthesizer 200 at the same time with gradually locking a frequency $f_0$ of the synthesized signal according to the divided frequency signal. Afterwards, the ring oscillator 320 is served as the sub-harmonic injection locking to lock the frequency of the synthesized signal to become a threefold frequency $3f_0$. Here, the ring oscillator may determine whether the divided signals respectively received from each time point generate an oscillating condition. If the determination is "yes", the LC tank in the ring oscillator is drifted and produces a phase to compensate the phase variations between the signals, so that the frequency corresponding to the production of drift is gradually locked to the frequency $f_0$ or the threefold frequency $3f_0$ of the synthesized signal. As a result, the present disclosure is indeed capable of filtering the high-frequency noise resulted from the low-frequency frequency synthesizer 200 while locking the synthesized frequency without using extra filter.

Figure 5:
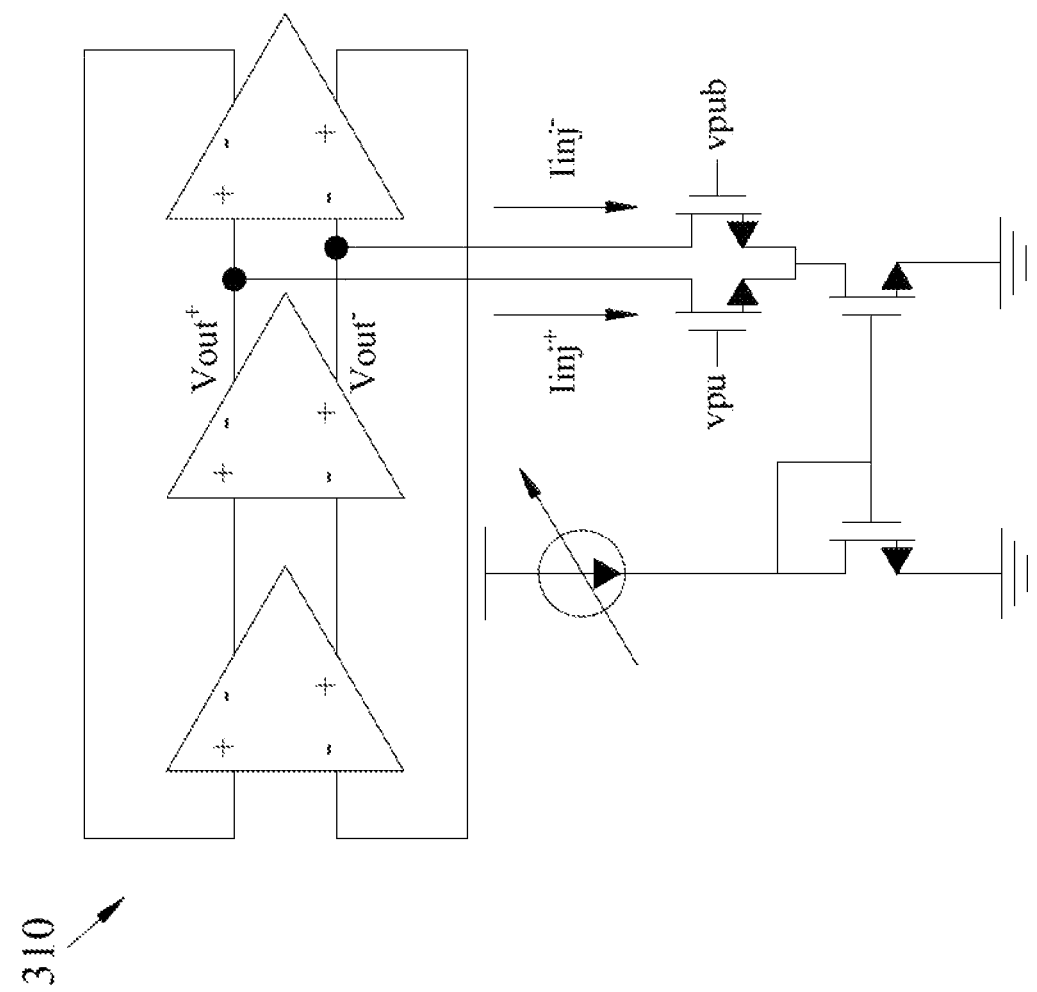
FIG. 5 is a schematic diagram illustrating the first embodiment of the circuit implementation of the injection locking device of the ultra-low power transmitter applied in the multi-channel frequency shift keying communication of the present disclosure.
Figure 6:
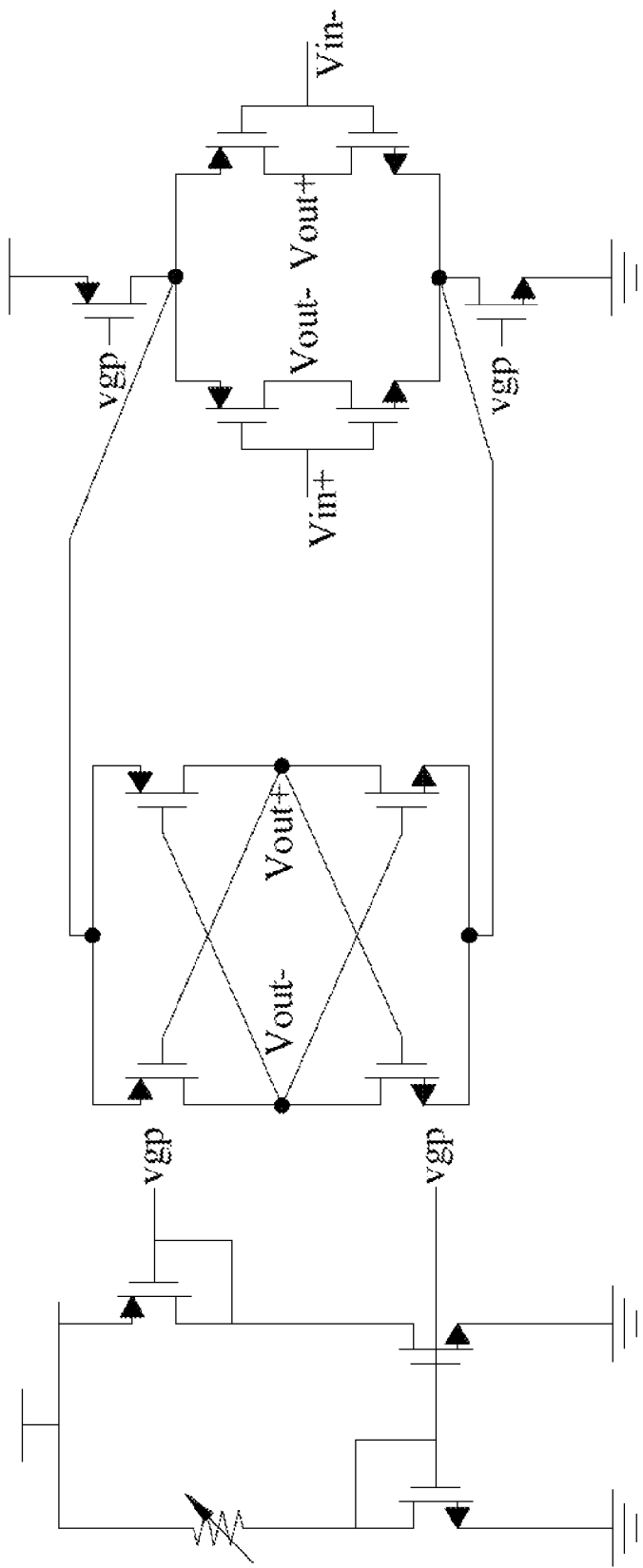
FIG. 6 is a schematic diagram illustrating the second embodiment of the circuit implementation of the injection locking device of the ultra-low power transmitter applied in the multi-channel frequency shift keying communication of the present disclosure.
Figure 7:
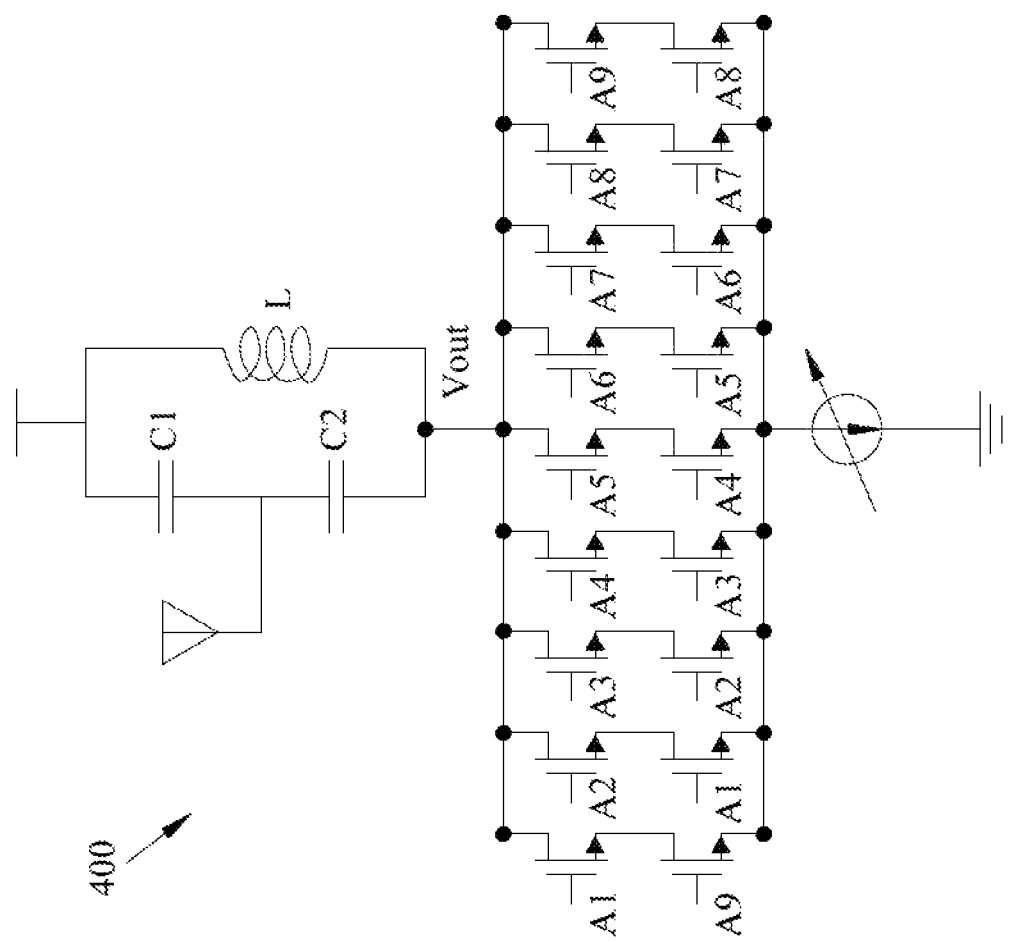
FIG. 7 is a schematic diagram illustrating the circuit implementation of the frequency multiplier of the ultra-low power transmitter applied in the multi-channel frequency shift keying communication of the present disclosure.

Besides, please refer to FIG. 5 through FIG. 6, which are a schematic diagram illustrating the first embodiment of the circuit implementation of the injection locking device of the ultra-low power transmitter applied in the multi-channel frequency shift keying communication of the present disclosure, and a schematic diagram illustrating the second embodiment of the circuit implementation of the injection locking device of the ultra-low power transmitter applied in the multi-channel frequency shift keying communication of the present disclosure, respectively. As shown in FIG. 1 through FIG. 6, the signal vpu and the signal vpup are input to the ring oscillator 310, wherein the signals vpu and vpup may be obtained from passing the divided frequency signal through a forward circuit and a reverse circuit, respectively, and the duty cycle of the divided frequency signal may be 50%, but it shall be not limited thereto. Because the signal vpu and the signal vpup have a phase vibration by 180 degrees, the current volumes injected to each node are the same. Thereby, the injection locking device 300 has better injection efficiency. Here, the circuit of the injection locking device 300 further utilizes the current-starved structure with cross-couple pairs to promote the property of the filter, and uses the current control to adjust the frequency of the signal, wherein the circuit thereof is shown in FIG. 6.

Moreover, the ultra-low power transmitter of the present disclosure can further include a data loading device 510 electrically connected to the fractional signal provider 210. The data loading device 510 can provide the fractional signal provider 210 with data. The fractional signal provider 210 provides the divisor provider 220 with different fractional signals according to the different received data. Therefore, the injection locking device 300 generates frequency-locked signals having different locked frequencies to represent different data, such that the data can be modulated to different frequencies to achieve the transmitter applied in multi-channel frequency shift keying (FSK) communication.

For example, the data loading device 510 can sequentially provide the fractional signal provider 210 with one set of data, and the set of data may contain bit "0" and bit "1". When the fractional signal provider 210 receives the bit "0", a first fractional signal is provided to the divisor provider 220; and when the fractional signal provider 210 receives the bit "1", a second fractional signal is provided to the divisor provider 220. Here, the first fractional signal differs from the second fractional signal, such that the injection locking device 300 generates frequency-locked signals having different locked frequencies to respectively correspond to the bit "0" and the bit "1" of the set of data. In addition, the data loading device 510 can further sequentially provide the other set of data to the fractional signal provider 210, wherein the other set of data may contain bit "0" and bit "1". When the fractional signal provider 210 receives the bit "0" of the other set of data, a third fractional signal is provided to the divisor provider 220; and when the fractional signal provider 210 receives the bit "1" of the other set of data, a fourth fractional signal is provided to the divisor provider 220. Here, the first through the fourth fractional signals are not the same with each other, such that the injection locking device 300 generates frequency-locked signals having different locked frequencies to respectively correspond to the bit "0" and the bit "1" of the other set of data. As a result, the present disclosure is capable of modulating different data to different frequencies so as to achieve the transmitter applied in multi-channel FSK communication, but it shall be not limited thereto. The present disclosure is also capable of combining a plurality of bits to become a byte, and the locked frequency of the frequency-locked signal resulted from the injection locking device 300 corresponds to the byte so as to achieve the transmitter applied in multi-channel FSK communication.

Furthermore, the ultra-low power transmitter of the present disclosure can further include a frequency multiplier 400 electrically connected to the injection locking device 300. The frequency multiplier 400 generates a high-frequency emission signal by multiplying the locked frequency of the frequency-locked signal. Please refer to FIG. 7, which is a schematic diagram illustrating the circuit implementation of the frequency multiplier of the ultra-low power transmitter applied in the multi-channel frequency shift keying communication of the present disclosure. As shown in FIG. 1 through FIG. 7, the frequency multiplier 400 may be consisted of a plurality of ring filters which are cascaded with one another and end to end. Thereby, the locked frequency of the frequency-locked signal can be modulated to the desired carrier frequency, which is set to be used in the transmission. For example, the frequency multiplier 400 can be consisted of nine ring filters which are cascaded with one another and end to end. Thereby, the locked frequency of the frequency-locked signal can be multiplied by nine. In the circuit implementation of FIG. 7, L represents inductor, C1 and C2 represent capacitors, and A1 to A9 represent the ring oscillators output from device. The output of the nine-stage ring oscillator has a specific delay time with each other. When parts of output signals are overlapped, the voltage Vout has voltage drop. The edge combiner has the voltage Vout with a time cycle by nine times. That is, the frequency of the high-frequency emission signal, which is resulted from the frequency multiplier 400, is ninefold as the locked frequency of the frequency-locked signal. However, it shall be not limited thereto, the present disclosure is capable of adjusting the frequency of the high-frequency emission signal to the transmissible band according to different architectures of the frequency multipliers.

Therefore, because the low-frequency frequency synthesizer 200 divides the reference frequency with corresponding divisors based on a time sequence for generating a plurality of divided frequency signals and applies the control input to control the divisors, the purpose of multi-channel communication can be achieved. Thereby, the data rate can be promoted. In addition, because the frequency-locked signal is multiplied after being generated by using the low-frequency frequency synthesizer 200 and the injection locking device 300, the accurate frequency control in the low-frequency band can be achieved. Moreover, with the frequency multiplication including different multiplying powers, the high-frequency band of the communication would be satisfied. Therefore, the transmitter applied in multi-channel FSK communication could be feasible. Besides, because the frequency is synthesized in low band, the power consumption could be reduced.

Furthermore, the frequency multiplier 400 has an emitter, such as an antenna or a set of antennas, for emitting the received high-frequency emission signal. Besides, the ultra-low power transmitter of the present disclosure may further include a data loading device 520 electrically connected to the frequency multiplier 400. The data loading device 520 adjusts the amplitude or the phase of the received high-frequency signal according to a desired data. Thereby, the transmitter applied to amplitude shift keying (ASK) or phase shift keying (PSK) communication can be achieved. Here, by means of the combination of the data loading device 510 and the data loading device 520, the data could be modulated to the frequency, amplitude, phase, or a combination thereof of the high-frequency signal, such that the combined modulated transmitter can be achieved.

While the means of specific embodiments in present disclosure has been described by reference drawings, numerous modifications and variations could be made thereto by those skilled in the art without departing from the scope and spirit of the invention set forth in the claims. The modifications and variations should in a range limited by the specification of the present disclosure.

What is claimed is:

1. An ultra-low power transmitter applied in multi-channel frequency shift keying (FSK) communication, comprising:
    a fixed-frequency generation device providing a reference frequency;
    a low-frequency frequency synthesizer receiving the reference frequency many times according to a time sequence, and dividing the reference frequency with corresponding divisor, such that a plurality of divided frequency signals being generated;
    a detecting element detecting a parameter of the fixed-frequency generation device; and
    an injection locking device electrically connected to the low-frequency frequency synthesizer, wherein the low-frequency frequency synthesizer injects the plurality of divided frequency signals to the injection locking device according to the time sequence, such that the injection locking device generates a frequency-locked signal and filters a high-frequency noise resulted from the low-frequency frequency synthesizer at the same time, wherein the ultra-low power transmitter utilizes the frequency-locked signal to obtain a high-frequency emission signal,
    wherein the low-frequency frequency synthesizer comprises:
        a fractional signal provider providing a fractional signal;
        a divisor provider receiving the fractional signal from the fractional signal provider, wherein the divisor provider sequentially generates the divisors according to the fractional signal, wherein some of the divisors are the same; and
        a frequency divider electrically connected to the fixed-frequency generation device, the divisor provider and the injection locking device, wherein the frequency divider sequentially receives the reference frequency and the divisors to generate the divided frequency signals, wherein locked frequency of the frequency-locked signal relates to the fractional signal,
    wherein the detecting element provides the parameter to the fractional signal provider, and
    wherein the fractional signal provider adjusts the fractional signal according to the parameter.

2. The ultra-low power transmitter applied in multi-channel frequency shift keying (FSK) communication of claim 1, wherein the fixed-frequency generation device is a crystal oscillator or a micro electro mechanical systems oscillator.

3. The ultra-low power transmitter applied in multi-channel frequency shift keying (FSK) communication of claim 1, further comprising a data loading device electrically connected to the fractional signal provider, wherein the data loading device provides data to the fractional signal provider, wherein the fractional signal provider provides different fractional signals according to the data, so that the injection locking device generates the frequency-locked signal having different locked frequencies.

4. The ultra-low power transmitter applied in multi-channel frequency shift keying (FSK) communication of claim 1, wherein the divisor provider has a noise-shaping delta-sigma modulator and a noise cancellation circuit which are electrically connected with each other, wherein the noise-shaping delta-sigma modulator receives the fractional signal to generate the divisor and an quantization error noise, the noise cancellation circuit replaces the quantization error noise to a high frequency to change the quantization error noise to the high-frequency noise, wherein the injection locking device filters the high-frequency noise resulted from the noise-shaping delta-sigma modulator and locks the locked frequency of the frequency-locked signal at the same time.

5. The ultra-low power transmitter applied in multi-channel frequency shift keying (FSK) communication of claim 1, further comprising a frequency multiplier electrically connected to the injection locking device, the frequency multiplier multiplying the locked frequency of the frequency-locked signal to generate the high-frequency emission signal.

6. The ultra-low power transmitter applied in multi-channel frequency shift keying (FSK) communication of claim 1, further comprising a data loading device receiving the high-frequency emission signal, wherein the data loading device adjusts an amplitude or a phase of the high-frequency emission signal according to data so as to achieve an amplitude modulated transmitter or a phase modulated transmitter.

7. The ultra-low power transmitter applied in multi-channel frequency shift keying (FSK) communication of claim 1, wherein the injection locking device is formed of a plurality of ring oscillators.

* * * * *